(12) United States Patent
Heo et al.

(10) Patent No.: US 10,361,240 B2
(45) Date of Patent: Jul. 23, 2019

(54) BENDABLE X-RAY SENSOR

(71) Applicants: Rayence Co., Ltd., Gyeonggi-do (KR); VatechEwoo Holdings Co., Ltd., Gyeonggi-do (KR)

(72) Inventors: Sung Kyn Heo, Gyeonggi-do (KR); Ho Seok Lee, Gyeonggi-do (KR)

(73) Assignees: Rayence Co., Ltd., Gyeonggi-do (KR); VATECH EWOO Holdings Co., Ltd., Gyeonggi-do (KR)

(*) Notice: Subject to any disclaimer, the term of this patent is extended or adjusted under 35 U.S.C. 154(b) by 34 days.

(21) Appl. No.: 14/504,490

(22) Filed: Oct. 2, 2014

(65) Prior Publication Data
US 2015/0091117 A1    Apr. 2, 2015

(30) Foreign Application Priority Data

Oct. 2, 2013 (KR) .................. 10-2013-0118004
Oct. 2, 2013 (KR) .................. 10-2013-0118005

(51) Int. Cl.
*H01L 27/146* (2006.01)
*G01T 1/20* (2006.01)
(Continued)

(52) U.S. Cl.
CPC .......... *H01L 27/14663* (2013.01); *G01T 1/20* (2013.01); *G01T 1/2002* (2013.01); *G01T 1/2018* (2013.01); *G01T 1/24* (2013.01); *G21K 4/00* (2013.01); *H01L 27/14601* (2013.01); *H01L 27/14625* (2013.01);
(Continued)

(58) Field of Classification Search
CPC ........... G01T 1/2018; G01T 1/24; G01T 1/20; G01T 1/202; G01T 1/2928; G01T 1/2006; G01T 1/242; G01T 1/36; H01L 27/14663; H01L 27/308; H01L 31/085; H01L 27/14658; H01L 27/14676; A61B 6/42; A61B 6/4208; G21K 4/00
USPC ................. 250/370.09, 370.11; 257/40, 428, 257/E27.146, E31.092
See application file for complete search history.

(56) References Cited

U.S. PATENT DOCUMENTS 4,982,096 A * 1/1991 Fujii .................... G01T 1/2018
                                                250/366
5,171,996 A * 12/1992 Perez-Mendez ...... G01T 1/2006
                                                216/20
(Continued)

FOREIGN PATENT DOCUMENTS

JP    2006-052978 A    2/2006
JP    2006-052982 A    2/2006
(Continued)

*Primary Examiner* — David Chen
(74) *Attorney, Agent, or Firm* — IP Legal Services, LLC

(57) ABSTRACT

This invention relates to an X-ray sensor having flexible properties and to a method of manufacturing the same. This X-ray sensor includes an array substrate including a semiconductor layer having a light-receiving element; a scintillator panel bonded to the array substrate and including a scintillator layer; a first polymer layer attached to an outer surface of the array substrate by a first adhesive layer; a second polymer layer attached to an outer surface of the scintillator panel by a second adhesive layer; and a third adhesive layer disposed between the array substrate and the scintillator panel so as to attach the array substrate and the scintillator panel to each other.

4 Claims, 5 Drawing Sheets

(51) Int. Cl.
*G21K 4/00* (2006.01)
*H01L 27/30* (2006.01)
*G01T 1/24* (2006.01)
*H01L 31/08* (2006.01)

(52) U.S. Cl.
CPC ...... H01L 27/14685 (2013.01); H01L 27/308 (2013.01); H01L 31/085 (2013.01)

(56) References Cited

U.S. PATENT DOCUMENTS

| | | | |
|---|---|---|---|
| 6,393,092 | B1 | 5/2002 | Yoshida |
| 2004/0124360 | A1 | 7/2004 | Levin |
| 2004/0136493 | A1* | 7/2004 | Konno ................... A61B 6/032 378/19 |
| 2004/0178350 | A1* | 9/2004 | Nagano ................. G01T 1/2018 250/370.11 |
| 2006/0033031 | A1* | 2/2006 | Takeda ................. G01T 1/2018 250/370.11 |
| 2006/0131503 | A1 | 6/2006 | Freund et al. |
| 2007/0004102 | A1* | 1/2007 | Dairiki ................ H01L 27/1266 438/149 |
| 2009/0302324 | A1* | 12/2009 | Jiang ..................... B82Y 10/00 257/72 |
| 2010/0207033 | A1* | 8/2010 | Chen .................... H01L 31/085 250/370.11 |
| 2011/0133092 | A1 | 6/2011 | Hansen et al. |
| 2011/0133093 | A1 | 6/2011 | Jagannathan et al. |
| 2011/0310381 | A1* | 12/2011 | Kamata ..................... G01J 1/44 356/218 |
| 2012/0126128 | A1 | 5/2012 | Watanabe et al. |
| 2012/0181438 | A1 | 7/2012 | Watanabe et al. |
| 2013/0019462 | A1 | 1/2013 | Shoji et al. |
| 2013/0048864 | A1 | 2/2013 | Nakatsugawa |
| 2013/0168563 | A1 | 7/2013 | Kim et al. |
| 2013/0221230 | A1* | 8/2013 | Tredwell .................. G01T 1/20 250/366 |
| 2014/0014844 | A1 | 1/2014 | Watanabe et al. |

FOREIGN PATENT DOCUMENTS

| | | | |
|---|---|---|---|
| JP | 2008-096321 A | 4/2008 | |
| JP | 2011-117966 A | 6/2011 | |
| KR | 20-0268356 Y1 | 3/2002 | |
| KR | 10-2013-0076431 A | 7/2013 | |
| WO | WO 2010047494 A2 * | 4/2010 | ........... A61B 6/4233 |
| WO | 2011/125383 A1 | 10/2011 | |

* cited by examiner

BENDABLE X-RAY SENSOR

CROSS REFERENCE TO PRIOR APPLICATIONS

The present application claims priority under 35 U.S.C. § 119 to Korean Patent Application Nos. 10-2013-0118004 (filed on Oct. 2, 2013) and 10-2013-0118005 (filed on Oct. 2, 2013), which are hereby incorporated by reference in their entireties.

BACKGROUND OF THE INVENTION

1. Field of the Invention

The present invention relates to an X-ray sensor, and more particularly, to an X-ray sensor having flexible properties and a method of manufacturing the same.

2. Description of the Related Art

Typically, medical or industrial X-ray imaging has been performed using films and screens, but is inefficient in terms of cost and time due to the problems of development and storage of the films used.

To solve such problems, thorough research into an imaging system using a digital X-ray sensor is ongoing.

An X-ray sensor may include a direct conversion X-ray sensor and an indirect conversion X-ray sensor. A direct conversion X-ray sensor directly converts X-rays into an electrical signal using a photoconductor, and an indirect conversion X-ray sensor converts X-rays into visible light by a scintillator so that the visible light is converted into an electrical signal using a photovoltaic device.

Since such a direct conversion X-ray sensor is operated at high voltage, it causes problems of dielectric breakdown and low reliability. Hence, an indirect conversion X-ray sensor is mainly utilized.

However, an indirect conversion X-ray sensor is problematic because it has a fixed shape and thus is not bendable due to the processes of forming an array element such as a light-receiving element, a transistor, etc. on a hard substrate.

Attributed to the structural limitation of such an X-ray sensor, even when the scintillator having flexible properties is used, the X-ray sensor itself does not have flexible properties. Therefore, it is difficult to cope with various shapes and curvatures of target to be examined.

SUMMARY OF THE INVENTION

Accordingly, the present invention has been made keeping in mind the above problems encountered in the related art, and an object of the present invention is to provide an X-ray sensor having flexible properties.

In order to accomplish the above object, the present invention provides an X-ray sensor, including: an array substrate including a semiconductor layer having a light-receiving element; a scintillator panel bonded to the array substrate and including a scintillator layer; a first flexible layer attached to an outer surface of the array substrate; a second flexible layer attached to an outer surface of the scintillator panel; and an adhesive layer disposed between the array substrate and the scintillator panel so as to attach the array substrate and the scintillator panel to each other.

In addition, the present invention, a method of manufacturing an X-ray sensor, comprising: (a) sequentially forming a semiconductor layer, a light-receiving element, and a driving element layer on a surface of a semiconductor substrate, and partially or completely removing the semiconductor substrate, thus forming an array substrate; (b) forming a scintillator panel including a scintillator layer; (c) attaching a first flexible layer to an outer surface of the array substrate, attaching a second flexible layer to an outer surface of the scintillator panel, and bonding the array substrate and the scintillator panel using a adhesive layer.

According to the present invention, in the manufacture of an X-ray sensor, the semiconductor substrate of an array substrate is removed by a predetermined thickness and is thus made thin. Therefore, the array substrate and the X-ray sensor have flexible properties, making it possible to effectively deal with transmission targets having various shapes and curvatures.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

Hereinafter, a detailed description will be given of embodiments of the present invention with reference to the appended drawings. Depending on specific constructions and functions, embodiments of the present invention are specified below.

Figure 1:
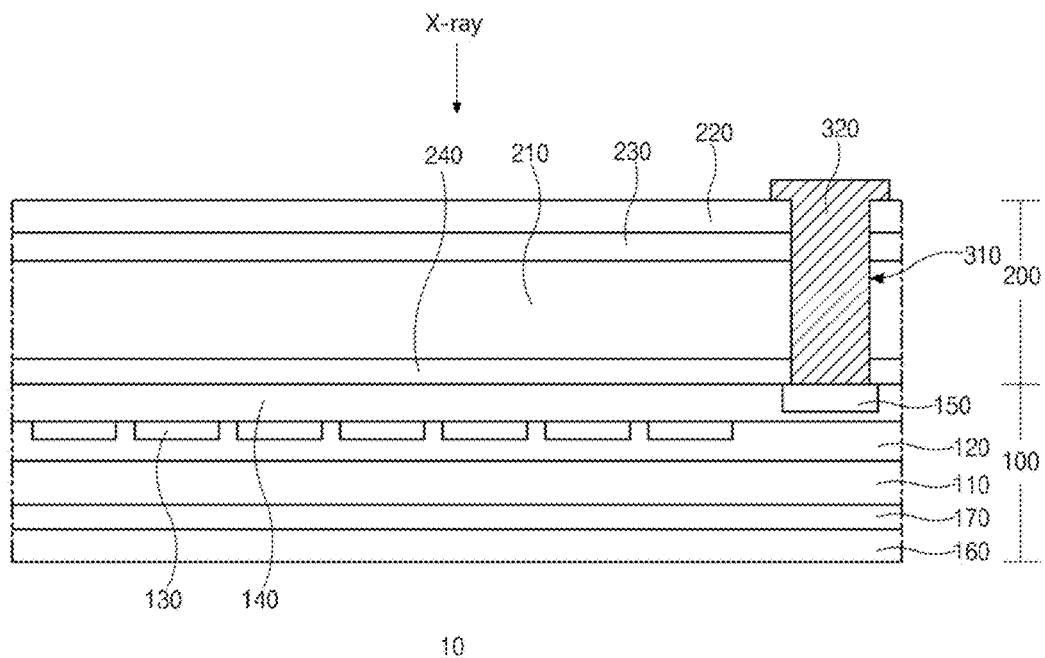
FIG. 1 is a cross-sectional view schematically illustrating an X-ray sensor according to a first embodiment of the present invention.

FIG. 1 is a cross-sectional view schematically illustrating an X-ray sensor according to a first embodiment of the present invention.

As illustrated in FIG. 1, the X-ray sensor 10 according to the first embodiment of the present invention may include an array substrate 100 having light-receiving elements 130, and a scintillator panel 200 formed on a surface of the array substrate 100.

The array substrate 100 may include a semiconductor substrate 110 that is a base substrate with a semiconductor layer 120, light-receiving elements 130, a driving element layer 140, and a pad 150.

The semiconductor substrate 110 may be exemplified by a silicon substrate doped with a P type or N type impurity. In an embodiment of the present invention, for the sake of description, the use of a high concentration P+ silicon substrate is exemplified.

In the X-ray sensor 10, the rear surface of the semiconductor substrate 110 is removed by a predetermined thickness, and the semiconductor substrate 110 is thus made thin. Accordingly, the semiconductor substrate 110 may have flexible properties.

The semiconductor layer 120 is formed on the first surface corresponding to the upper surface of the semiconductor substrate 110 by epitaxial growth. The semiconductor layer 120 has the same conductive type as that of the semiconductor substrate 110, and may be formed of, for example, a low concentration P− type impurity.

In the semiconductor layer 120, the light-receiving elements 130 such as photodiodes may be provided in the form of a matrix per pixel region. The light-receiving elements 130 receive visible light so that the visible light is converted into an electrical image signal.

The driving element layer 140 including driving elements such as transistors may be formed on the semiconductor layer 120, for operating the light-receiving elements 130. The driving element layer 140 includes at least one insulating film and at least one metal film, and may have a variety of signal wires connected to the driving elements. Although the semiconductor layer 120 where the light-receiving elements 130 are formed and the driving element layer 140 where the driving elements are separately depicted in the drawing, some of the light-receiving elements 130 may be formed in the driving element layer 140 and some of the driving elements may be formed in the semiconductor layer 120.

At an edge of the driving element layer 140, the pad 150 may be formed to be disposed at least one end of each signal wire. Such a pad 150 is electrically connected to an external driving circuit (not shown), and thus may receive a driving signal and may output an image signal.

A polymer layer 160 having flexible properties may be formed on the rear surface of the semiconductor substrate 110, namely, the second surface corresponding to the surface opposite the surface where the semiconductor layer 120 is formed. The material for the polymer layer 160 may include, but is not limited to, for example, polyimide.

Further, an adhesive layer 170 is formed between the polymer layer 160 and the semiconductor substrate 110, and the polymer layer 160 may be attached to the semiconductor substrate 110 by means of the corresponding adhesive layer 170. For the sake of description, the polymer layer 160 and the adhesive layer 170, as mentioned above, refer to a first polymer layer 160 and a first adhesive layer 170, respectively.

The scintillator panel 200 is formed on the upper surface of the array substrate 100, namely, the surface where the driving element layer 140 is formed.

The scintillator panel 200 may include a scintillator layer 210 for converting incident X-rays into visible light, and a polymer layer 220 formed on the upper surface of the scintillator layer 210.

The scintillator layer 210 having flexible properties may include, as a typical scintillator, a scintillator using CsI, or a scintillator using Gadox (Gd2O2:Tb). Particularly useful is a scintillator using Gadox. The material for the polymer layer 220 may include, but is not limited to, for example, polyimide.

The scintillator panel 200 may further include adhesive layers 230, 240 respectively formed on the third and the fourth surface as the upper and the lower surface of the scintillator layer 210. As such, the third surface corresponds to an incident surface on which X-rays are incident. For the sake of description, the polymer layer 220 and the adhesive layers 230, 240 of the scintillator panel 200 refer to a second polymer layer 220 and a second and a third adhesive layer 230, 240, respectively.

The second polymer layer 220 may be attached to the scintillator layer 210 via the second adhesive layer 230. The scintillator panel 200 may be attached to the array substrate 100 by the third adhesive layer 240.

The scintillator panel 200 may include a pad hole 310 for externally exposing the pad 150. Also, a terminal electrode 320 that comes into contact with the pad 150 via the pad hole 310 is formed. The terminal electrode 320 may be formed on the outer surface of the scintillator panel 200, namely, the incident surface on which X-rays are incident. Thereby, the pad 150 may be electrically connected to an external driving circuit.

The second polymer layer 220 and the second adhesive layer 230 are positioned on the incident path of X-rays, and may be formed of a material able to minimize the absorption of X-rays. To this end, the second polymer layer 220 and the second adhesive layer 230 may be made of a material having an atomic number lower than that of the scintillator layer 210.

In order to minimize loss of visible light that is generated from the scintillator layer 210 and is incident on the light-receiving elements 130, the scintillator layer 210, the third adhesive layer 240 and the driving element layer 140 on the travel path of visible light may be configured such that the refractive indexes thereof are increased in the sequence thereof. Specifically, when the refractive indexes of the scintillator layer 210, the third adhesive layer 240 and the driving element layer 140 are n1, n2 and n3, respectively, they have a relation of n1<n2<n3, thus preventing total reflection. The refractive index of the driving element layer 140 corresponds to the refractive index of the insulating film of the driving element layer 140 positioned on the light-receiving elements 130.

As mentioned above, the array substrate 100 has flexible properties by thinly forming the semiconductor substrate 110 serving as a base substrate. The scintillator panel 200 has flexible properties due to the use of the scintillator layer 210 having flexible properties. Therefore, the X-ray sensor 10 has flexible properties, and may thus be curved so as to be adapted for the shape of a transmission target.

Provided on both outermost sides of the X-ray sensor 10 may be the first and the second polymer layer 160, 220 having flexible properties, which function to minimize fatigue due to the bending of the X-ray sensor 10.

In regard to the minimum fatigue of the X-ray sensor 10, a flexible object undergoes stress and tension at the upper and the lower portion thereof depending on the bending direction thereof. As such, a neutral plane where the sum of stress and tension is zero is formed, and physical fatigue is minimized on the corresponding neutral plane.

Hence, the neutral plane for minimizing the fatigue of the X-ray sensor 10 is determined by the thickness of the X-ray sensor 10, and thus the thickness of the adhesive layers 170, 230, 240 and the polymer layers 160, 220 may be determined taking into consideration the thickness of the scintillator layer 210, the semiconductor substrate 110, the epitaxial layer 120 and the driving element layer 140.

Below is a description of a method of manufacturing the X-ray sensor according to the first embodiment of the present invention, with reference to FIGS. 2 to 5.

FIGS. 2 to 5 are cross-sectional views schematically illustrating a process of manufacturing the X-ray sensor according to the first embodiment of the present invention.

Figure 2:
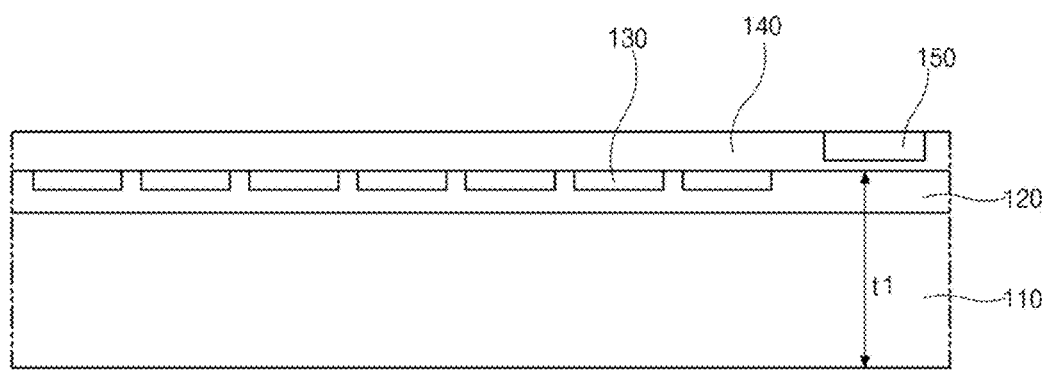
FIGS. 2 to 5 are cross-sectional views schematically illustrating a process of manufacturing the X-ray sensor according to the first embodiment of the present invention.

As illustrated in FIG. 2, the semiconductor layer 120 is formed on the first surface of the semiconductor substrate 110 by epitaxial growth, and the light-receiving elements 130, the driving element layer 140 and the pad 150 are sequentially formed. As such, the first thickness t1 of the semiconductor substrate 110 including the semiconductor layer 120 may be, but is not limited to, about 700~800 μm.

Figure 3:
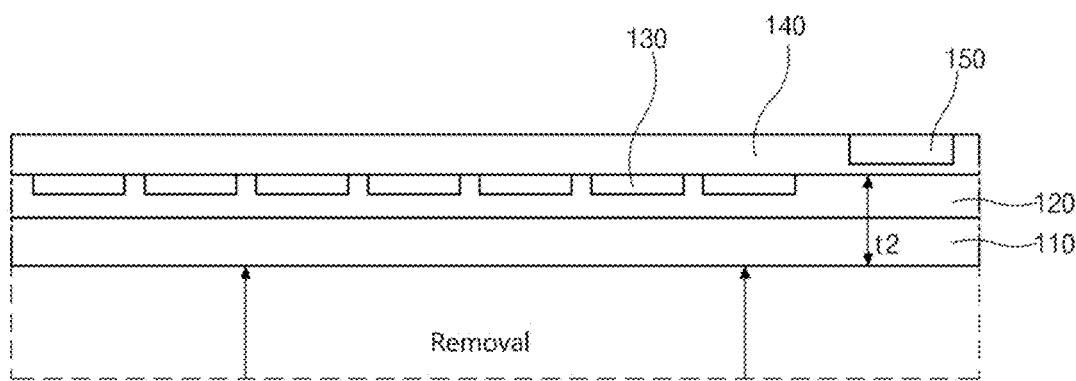

Next, as illustrated in FIG. 3, the rear surface, that is, the second surface of the semiconductor substrate 110 is removed by a predetermined thickness. Accordingly, the semiconductor substrate 110 including the semiconductor layer 120 has a second thickness t2 less than the first thickness t1. As such, the second thickness t2 may be, but is not limited to, about 10~150 µm, and particularly 30~70 µm. If the second thickness t2 of the semiconductor substrate 110 including the semiconductor layer 120 is less than 10 µm, the X-ray sensor may be easily broken during the manufacturing process and usage thereof. In contrast, if the second thickness thereof exceeds 150 µm, the X-ray sensor is not bendable, and thus desired flexible properties cannot be exhibited.

Removing the semiconductor substrate 110 may be performed using a variety of processes. For example, a grinding process for mechanically grinding a substrate, a CMP (Chemical Mechanical Polishing) process, etc., may be applied, but the present invention is not limited thereto. As such, the semiconductor substrate 110 may be completely removed so that only the semiconductor layer 120 is left behind, if necessary.

Figure 4:
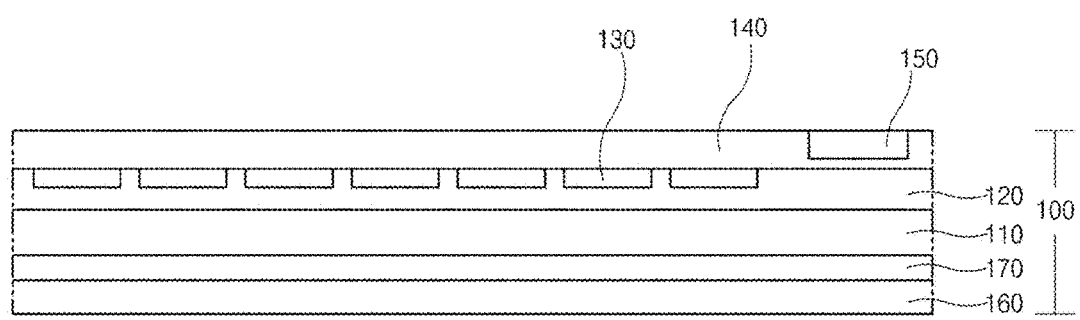

Next, as illustrated in FIG. 4, the first polymer layer 160 is attached to the second surface of the semiconductor substrate 110 including the semiconductor layer 120 with the second thickness t2. The first polymer layer 160 may be attached to the semiconductor substrate 110 by means of the first adhesive layer 170.

The first polymer layer 160 may function as a protective layer for preventing handling damage in the course of transporting the array substrate 100 so as to be attached to the scintillator panel 200.

Figure 5:
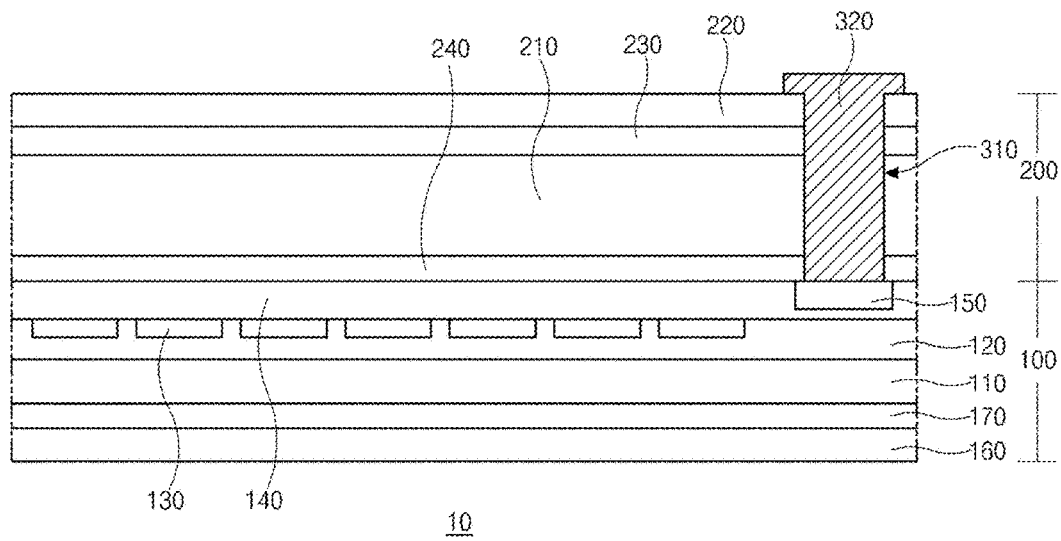

Next, as illustrated in FIG. 5, the array substrate 100 having the first polymer layer 160 attached thereto is bonded with the scintillator panel 200.

The scintillator panel 200 may be manufactured separately from the array substrate 100. For example, the scintillator layer 210 is formed and then the second and the third adhesive layer 230, 240 are formed on the third and the fourth surface, respectively, and the second polymer layer 220 is attached by the second adhesive layer 230.

The scintillator panel 200 thus manufactured may be attached to the array substrate 100 by means of the third adhesive layer 240.

Next, a portion of the scintillator panel 200 corresponding to the pad 150 is removed, thus forming the pad hole 310 for externally exposing the pad 150. For example, the region from the surface of the scintillator panel 200, namely, the incident surface to the surface of the pad 150 of the array substrate 100 may be removed by laser processing, thus forming the pad hole 310. Alternatively, etching may be performed using a photolithographic process, thus forming the pad hole 310.

Next, the terminal electrode 320 that comes into contact with the pad 150 via the pad hole 310 is formed.

By the manufacturing procedures as above, the X-ray sensor 10 according to the first embodiment of the present invention may be manufactured.

According to the first embodiment of the present invention, the semiconductor substrate of the array substrate is removed by a predetermined thickness and is thus made thin in the course of manufacturing the X-ray sensor. Therefore, the array substrate and the X-ray sensor have flexible properties, and may thus be effectively applied to transmission targets having various shapes and curvatures.

Figure 6:
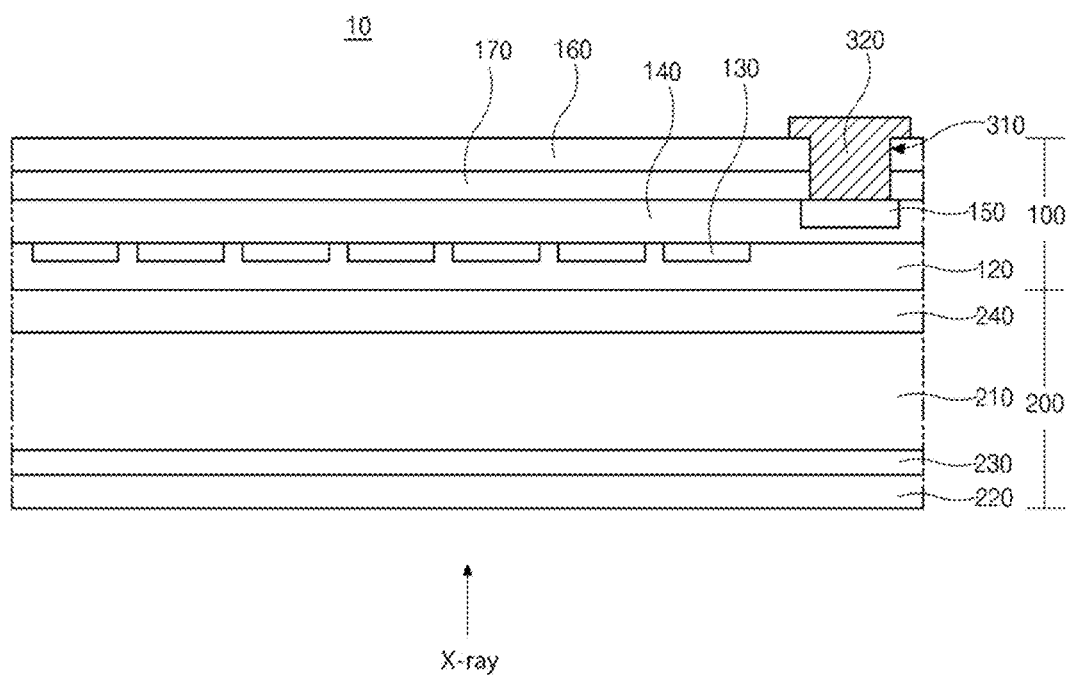
FIG. 6 is a cross-sectional view schematically illustrating an X-ray sensor according to a second embodiment of the present invention.

FIG. 6 is a cross-sectional view schematically illustrating an X-ray sensor according to a second embodiment of the present invention. For the sake of description, the same constructions having the same functions as in the first embodiment are designated by the same reference numerals.

As illustrated in FIG. 6, the X-ray sensor 10 according to the second embodiment of the present invention may include an array substrate 100 having light-receiving elements 130, and a scintillator panel 200 formed on a surface of the array substrate 100.

The array substrate 100 may include a semiconductor substrate 110 including a semiconductor layer 120, light-receiving elements 130, a driving element layer 140, and a pad 150.

The semiconductor layer 120 is formed by epitaxial growth on the upper surface of the semiconductor substrate that is used as a base substrate in the course of manufacturing the array substrate 100. The semiconductor layer 120 has the same conductive type as that of the semiconductor substrate, and may be formed of, for example, a low concentration P– type impurity.

The semiconductor substrate may be completely removed after formation of the semiconductor layer 120. Alternatively, the semiconductor substrate may be partially removed and may thus be left behind. For the sake of description, complete removal of the semiconductor substrate is illustrated in the drawing.

The semiconductor layer 120 may be configured such that the light-receiving elements 130 such as photodiodes may be provided in the form of a matrix per pixel region. The light-receiving elements 130 receive visible light so that the visible light is converted into an electrical image signal.

On the first surface corresponding to the upper surface of the semiconductor layer 120, a driving element layer 140 including driving elements such as transistors for operating the light-receiving elements 130 may be formed. The driving element layer 140 includes at least one insulating film and at least one metal film, and may have a variety of signal wires connected to the driving elements. Although the semiconductor layer 120 having the light-receiving elements 130 and the driving element layer 140 having the driving elements are separately depicted in the drawing, some of the light-receiving elements 130 may be formed in the driving element layer 140 and some of the driving elements may also be formed in the semiconductor layer 120.

At an edge of the driving element layer 140, the pad 150 provided on at least one end of each signal wire, may be formed. Such a pad 150 is electrically connected to an external driving circuit, and thus may receive a driving signal and may output an image signal.

Also, a polymer layer 160 having flexible properties may be formed on the driving element layer 140. The material for the polymer layer 160 may include, but is not limited to, for example, polyimide.

Further, an adhesive layer 170 is disposed between the polymer layer 160 and the driving element layer 140, and the polymer layer 160 may be attached to the driving element layer 140 by means of the corresponding adhesive layer 170. For the sake of description, the polymer layer 160 and the adhesive layer 170, as mentioned above, refer to a first polymer layer 160 and a first adhesive layer 170, respectively.

The first polymer layer 160 of the array substrate 100 may include a pad hole 310 for externally exposing the pad 150. Also, a terminal electrode 320 that comes into contact with the pad 150 via the pad hole 310 is formed. The terminal electrode 320 may be formed on the outer surface of the array substrate 100, namely, the surface opposite the incident surface on which X-rays are incident. Thereby, the pad 150 may be electrically connected to an external driving circuit.

The scintillator panel 200 is formed on the second surface that is the lower surface of the semiconductor layer 120, as the lower surface of the array substrate 100.

The scintillator panel 200 may include a scintillator layer 210 for converting incident X-rays into visible light, and a polymer layer 220 formed on the lower surface of the scintillator layer 210.

The scintillator layer 210 having flexible properties may include, as a typical scintillator, a scintillator using CsI, or a scintillator using Gadox (Gd2O2:Tb). Particularly useful is a scintillator using Gadox. The material for the polymer layer 220 may include, but is not limited to, for example, polyimide.

The scintillator panel 200 may further include adhesive layers 230, 240 respectively formed on the third and the fourth surface as the upper and the lower surface of the scintillator layer 210. As such, the fourth surface corresponds to an incident surface on which X-rays are incident. For the sake of description, the polymer layer 220 and the adhesive layers 230, 240 of the scintillator panel 200 refer to a second polymer layer 220 and a second and a third adhesive layer 230, 240, respectively.

The second polymer layer 220 may be attached to the scintillator layer 210 by the second adhesive layer 230. The scintillator panel 200 may be attached to the array substrate 100 by the third adhesive layer 240.

The second polymer layer 220 and the second adhesive layer 230 are positioned on the incident path of X-rays, and may be formed of a material able to minimize the absorption of X-rays. To this end, the second polymer layer 220 and the second adhesive layer 230 may be made of a material having an atomic number lower than the scintillator layer 210.

In order to minimize loss of visible light that is generated from the scintillator layer 210 and is incident on the light-receiving elements 130, the scintillator layer 210, the third adhesive layer 240 and the semiconductor layer 120 on the travel path of visible light may be configured such that the refractive indexes thereof are increased in the sequence thereof. Specifically, when the refractive indexes of the scintillator layer 210, the third adhesive layer 240 and the semiconductor layer 120 are n1, n2 and n3, respectively, they have a relation of n1<n2<n3, thus preventing total reflection.

As mentioned above, the array substrate 100 has flexible properties by removing the semiconductor substrate, which is a base substrate. The scintillator panel 200 has flexible properties due to the use of the scintillator layer 210 having flexible properties. Therefore, the X-ray sensor 10 has flexible properties, and may thus be curved so as to be adapted for the shape of a transmission target.

The scintillator panel 200 is disposed on the surface opposite the surface where the driving element layer 140 is formed. Accordingly, the light-receiving elements 130 may be formed over the entire pixel region, thus increasing fill factor.

Provided on both outermost sides of the X-ray sensor 10 may be the first and the second polymer layer 160, 220 having flexible properties, which function to minimize fatigue due to the bending of the X-ray sensor 10.

In regard to the minimum fatigue of the X-ray sensor 10, a flexible object undergoes stress and tension at the upper and the lower portion thereof depending on the bending direction thereof. As such, a neutral plane where the sum of stress and tension is zero is formed, and physical fatigue is minimized on the corresponding neutral plane.

Hence, the neutral plane for minimizing the fatigue of the X-ray sensor 10 is determined by the thickness of the X-ray sensor 10, and the thickness of the adhesive layers 170, 230, 240 and the polymer layers 160, 220 may be determined taking into consideration the thickness of the scintillator layer 210, the semiconductor layer 120 and the driving element layer 140.

Below is a description of a method of manufacturing the X-ray sensor according to the second embodiment of the present invention, with reference to FIGS. 7 to 10.

FIGS. 7 to 10 are cross-sectional views schematically illustrating a process of manufacturing the X-ray sensor according to the second embodiment of the present invention.

Figure 7:
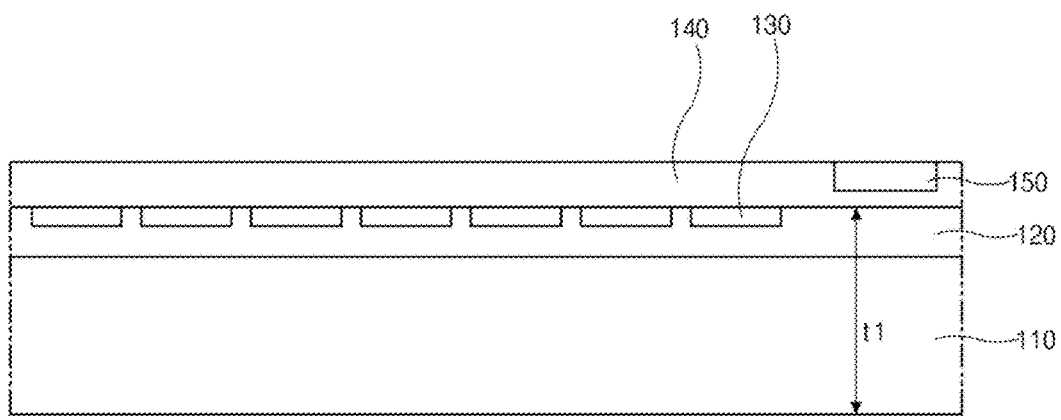
FIGS. 7 to 10 are cross-sectional views schematically illustrating a process of manufacturing the X-ray sensor according to the second embodiment of the present invention.

As illustrated in FIG. 7, the semiconductor layer 120 is formed by epitaxial growth on the upper surface of the semiconductor substrate 110 having a thickness t1, and the light-receiving elements 130, the driving element layer 140 and the pad 150 are sequentially formed.

As such, the thickness t1 of the semiconductor substrate 110 including the semiconductor layer 120 may be, but is not limited to, about 700~800 μm.

Figure 8:
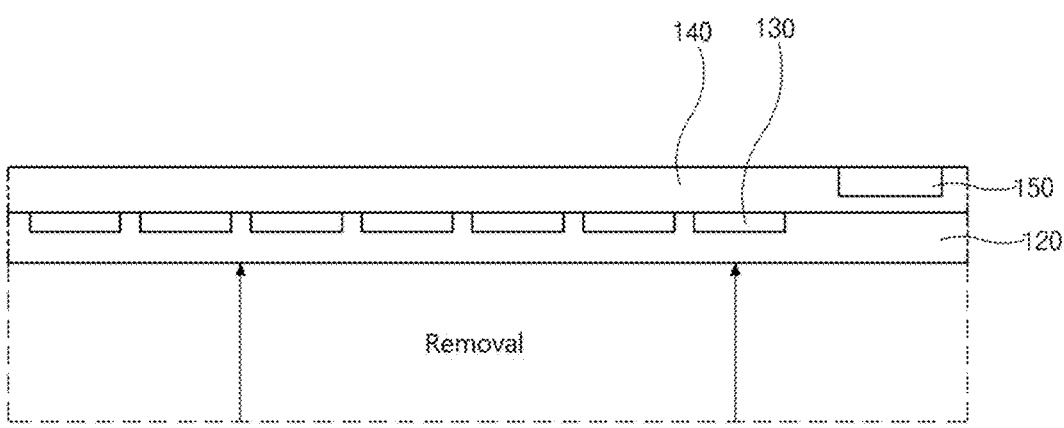

Next, as illustrated in FIG. 8, the semiconductor substrate 110 is removed from its rear surface, that is, the second surface, and is thus deleted from the array substrate 100. Removing the semiconductor substrate 110 may be performed using a variety of processes, for example, a grinding process for mechanically grinding a substrate, a CMP process, etc., but the present invention is not limited thereto. Accordingly, the semiconductor substrate 110 including the semiconductor layer 120 has a thickness of about 10~150 μm, and preferably 10~50 μm by completely removing the semiconductor substrate 110 and partially removing the semiconductor layer 120, as necessary.

If the thickness of the semiconductor substrate 110 including the semiconductor layer 120 is less than 10 μm, the X-ray sensor may be easily broken during the manufacturing process and usage thereof. In contrast, if the thickness thereof exceeds 150 μm, the X-ray sensor is not bendable, and thus desired flexible properties cannot be manifested. Unlike the first embodiment, in the second embodiment, X-rays may pass through the semiconductor layer 120 and are thus incident on the light-receiving elements 130. Hence, to decrease unnecessary X-ray decay, the semiconductor substrate 110 may be completely removed and thus the thickness of the semiconductor layer 120 may be set to 10~50 μm.

Figure 9:
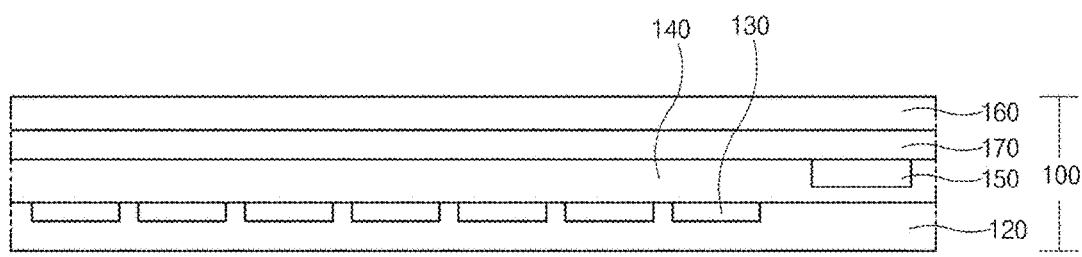

Next, as illustrated in FIG. 9, the first polymer layer 160 is attached to the upper surface of the array substrate 100 having no semiconductor substrate 110. The first polymer layer 160 may be attached by the first adhesive layer 170.

The first polymer layer 160 may play a role as a protective layer for preventing handling damage in the course of transporting the array substrate 100 so as to be attached to the scintillator panel 200.

Figure 10:
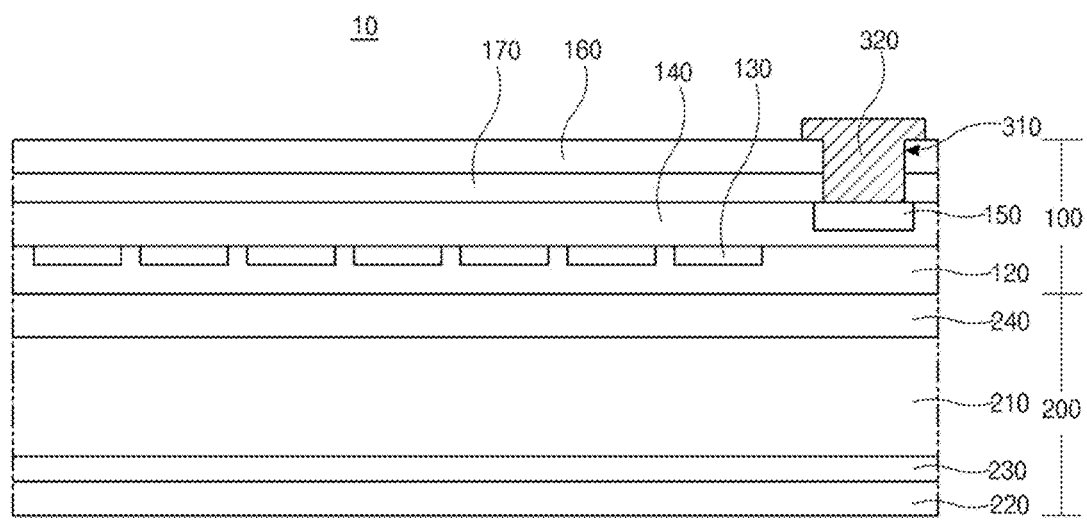

Next, as illustrated in FIG. 10, the array substrate 100 having the first polymer layer 160 attached thereto is bonded with the scintillator panel 200.

The scintillator panel 200 may be manufactured separately from the array substrate 100. For example, the scintillator layer 210 is formed, after which the third and the second adhesive layer 240, 230 are formed on the third and the fourth surface, respectively, and the second polymer layer 220 is attached by the second adhesive layer 230.

The scintillator panel 200 thus manufactured may be attached to the array substrate 100 by means of the third adhesive layer 240.

Next, a portion of the array substrate 100 corresponding to the pad 150 is removed, thus forming the pad hole 310 for externally exposing the pad 150. For example, the region from the surface of the array substrate 100, namely, the surface opposite the incident surface to the surface of the pad 150 may be removed by laser processing, thus forming the pad hole 310. Alternatively, etching may be performed using a photolithographic process, thus forming the pad hole 310.

Next, the terminal electrode 320 that comes into contact with the pad 150 via the pad hole 310 is formed.

By the manufacturing procedures as above, the X-ray sensor 10 according to the second embodiment of the present invention may be manufactured.

According to the second embodiment of the present invention, the semiconductor substrate serving as a base substrate of the array substrate is removed in the course of manufacturing the X-ray sensor. Therefore, the array substrate and the X-ray sensor have flexible properties, and may thus be effectively applied to transmission targets having various shapes and curvatures.

Furthermore, as the scintillator is disposed on the surface opposite the surface where the driving element layer is formed, the light-receiving elements may be formed over the entire pixel region, thus increasing fill factor.

Although the preferred embodiments of the present invention have been disclosed for illustrative purposes, those skilled in the art will appreciate that various modifications, additions and substitutions are possible, without departing from the scope the invention as disclosed in the accompanying claims.

What is claimed is:

1. An X-ray sensor, comprising:
    an array substrate including a semiconductor substrate, a first flexible layer formed on a bottom side of the semiconductor substrate, and a semiconductor layer formed on a top side of the semiconductor substrate and having at least one light-receiving element;
    a scintillator panel bonded to the array substrate, and wherein the scintillator panel includes a scintillator layer, a second flexible layer formed on a top side of the scintillator layer, and an adhesive layer disposed between the array substrate and the scintillator layer to attach the array substrate and the scintillator layer to each other;
    a pad hole formed through the scintillator panel and the second flexible layer,
    wherein a thickness of the semiconductor substrate and the semiconductor layer is about 10 μm~about 150 μm, and
    wherein the first flexible layer is a polymer layer and attached, by a second adhesive layer, to the bottom side of the semiconductor substrate,
    wherein the second adhesive layer is formed on the bottom side of the semiconductor substrate and bonds the first flexible layer and the semiconductor substrate,
    wherein the second flexible layer is a polymer layer and attached, by a third adhesive layer, to the top side of the scintillator layer, and
    wherein the third adhesive layer is formed on the top side of the scintillator layer and bonds the second flexible layer and the scintillator layer.

2. The X-ray sensor of claim 1, wherein the semiconductor layer has a thickness of about 10 μm~about 50 μm.

3. An X-ray sensor, comprising:
    an array substrate including a semiconductor substrate, a first flexible polymer layer, and a semiconductor layer having at least one light-receiving element;
    a scintillator panel bonded to the array substrate with a first adhesive layer and having a pad hole formed through the scintillator panel, wherein the scintillator panel includes a scintillator layer and a second flexible polymer layer; and
    wherein a thickness of the semiconductor substrate and the semiconductor layer is about 10 μm~about 150 μm,
    wherein a second adhesive layer attaches the first flexible polymer layer with the semiconductor substrate, and
    wherein a third adhesive layer attaches the second flexible polymer layer with the scintillator layer.

4. The X-ray sensor of claim 3, wherein the semiconductor layer has a thickness of about 10 μm~about 50 μm.

* * * * *